(12) United States Patent
Saenger et al.

(10) Patent No.: US 9,817,317 B2
(45) Date of Patent: Nov. 14, 2017

(54) OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventors: Ingo Saenger, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/513,944

(22) Filed: Oct. 14, 2014

(65) Prior Publication Data

US 2015/0085272 A1    Mar. 26, 2015

Related U.S. Application Data

(63) Continuation of application No. PCT/EP2013/056442, filed on Mar. 26, 2013.
(Continued)

(30) Foreign Application Priority Data

Apr. 16, 2012  (DE) .................. 10 2012 206 153

(51) Int. Cl.
G03F 7/20 (2006.01)
G02B 5/30 (2006.01)
(52) U.S. Cl.
CPC ....... *G03F 7/70191* (2013.01); *G02B 5/3066* (2013.01); *G02B 5/3075* (2013.01);
(Continued)
(58) Field of Classification Search
CPC ............... G02B 5/3066; G02B 5/3075; G03F 7/70075; G03F 7/70091; G03F 7/70108;
(Continued)

(56) References Cited

U.S. PATENT DOCUMENTS 6,137,618 A    10/2000 Herzinger
6,999,172 B2   2/2006 Masaki et al.
(Continued)

FOREIGN PATENT DOCUMENTS

CN    101069267 A    11/2007
CN    101243360 A    8/2008
(Continued)

OTHER PUBLICATIONS

Chinese Office Action and Search Report, with translation thereof, for CN Appln No. 201380020363.5, dated Dec. 30, 2015.
(Continued)

*Primary Examiner* — Michelle M Iacoletti
(74) *Attorney, Agent, or Firm* — Fish & Richardson P.C.

(57) ABSTRACT

The invention relates to an optical system of a microlithographic projection exposure apparatus, in particular for operation in the EUV, comprising at least one polarization-influencing arrangement having a first reflection surface and a second reflection surface, wherein the first reflection surface and the second reflection surface are arranged at an angle of 0°±10° or at an angle of 90°±10° relative to one another, wherein light incident on the first reflection surface during the operation of the optical system forms an angle of 45°±5° with the first reflection surface, and wherein the polarization-influencing arrangement is rotatable about a rotation axis running parallel to the light propagation direction of light incident on the first reflection surface during the operation of the optical system.

27 Claims, 10 Drawing Sheets

Related U.S. Application Data

(60) Provisional application No. 61/624,429, filed on Apr. 16, 2012.

(52) U.S. Cl.
CPC .......... *G03F 7/702* (2013.01); *G03F 7/70075* (2013.01); *G03F 7/70091* (2013.01); *G03F 7/70108* (2013.01); *G03F 7/70116* (2013.01); *G03F 7/70566* (2013.01)

(58) Field of Classification Search
CPC .. G03F 7/70116; G03F 7/70191; G03F 7/702; G03F 7/70566
See application file for complete search history.

(56) References Cited

U.S. PATENT DOCUMENTS

| | | | |
|---|---|---|---|
| 2003/0081210 | A1 | 5/2003 | Masaki et al. |
| 2005/0134825 | A1* | 6/2005 | Schuster ............... G02B 27/283 355/71 |
| 2006/0139611 | A1 | 6/2006 | Wagner et al. |
| 2007/0065732 | A1 | 3/2007 | Lee et al. |
| 2007/0132977 | A1 | 6/2007 | Komatsuda |
| 2008/0192225 | A1 | 8/2008 | Mann et al. |
| 2009/0034061 | A1 | 2/2009 | Dodoc et al. |
| 2009/0161201 | A1* | 6/2009 | Ershov ................. G03F 7/70033 359/333 |
| 2011/0122392 | A1 | 5/2011 | Fiolka et al. |
| 2011/0242517 | A1 | 10/2011 | Mann et al. |
| 2011/0273694 | A1 | 11/2011 | Werber et al. |
| 2011/0285979 | A1 | 11/2011 | Dieckmann et al. |
| 2013/0010352 | A1 | 1/2013 | Chan et al. |
| 2013/0077077 | A1 | 3/2013 | Saenger et al. |
| 2014/0111785 | A1 | 4/2014 | Hennerkes et al. |
| 2014/0132942 | A1 | 5/2014 | Saenger et al. |
| 2014/0192339 | A1 | 7/2014 | Seanger et al. |

FOREIGN PATENT DOCUMENTS

| | | |
|---|---|---|
| CN | 100483174 C | 4/2009 |
| CN | 101836151 A | 9/2010 |
| CN | 101836163 A | 9/2010 |
| CN | 102253464 A | 11/2011 |
| CN | 102272636 A | 12/2011 |
| DE | 10 2006 027 429 | 12/2006 |
| DE | 10 2008 002 749 A1 | 12/2009 |
| DE | 10 2011 078 928 A1 | 1/2013 |
| DE | 10 2011 084 266 A1 | 4/2013 |
| DE | 10 2012 208 521 A1 | 6/2013 |
| EP | 0 486 316 | 5/1992 |
| EP | 0486316 A2 | 5/1992 |
| EP | 0 486 316 | 4/2000 |
| EP | 1 306 665 | 5/2003 |
| EP | 1 811 547 | 7/2007 |
| EP | 1 811 547 A1 | 7/2007 |
| EP | 1672430 B1 | 2/2009 |
| JP | 2000-098231 | 4/2000 |
| JP | 2001-203136 | 7/2001 |
| JP | 2003-133212 | 5/2003 |
| JP | 04-225357 | 8/2004 |
| JP | 2005-303084 | 10/2005 |
| JP | 2008-538452 | 10/2008 |
| WO | WO 2006/082738 | 8/2006 |
| WO | WO 2006/111319 A2 | 10/2006 |
| WO | WO 2006/133801 A1 | 12/2006 |
| WO | WO 2009/052925 A1 | 4/2009 |

OTHER PUBLICATIONS

German Office Action, with translation thereof, for DE Appl No. 10 2012 206 153.3, dated Dec. 4, 2012.
International Search Report and Written Opinion for corresponding PCT Application No. PCT/EP2013/056442, dated Jun. 25, 2013.
International Preliminary Report on Patentability for corresponding PCT Application No. PCT/EP2013/056442, dated Oct. 30, 2014.
Japanese Office Action with English translation for Japanese App. Ser. No. 2015-506163, dated Dec. 28, 2016, 13 pages.
Taiwan Office Action and Search Report, with translation thereof, for corresponding TW Appl No. 102113337, dated Mar. 20, 2017.

* cited by examiner

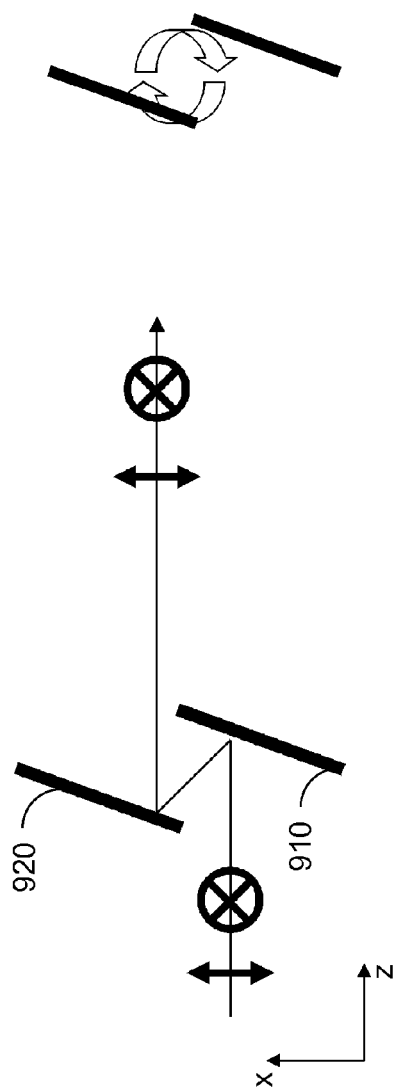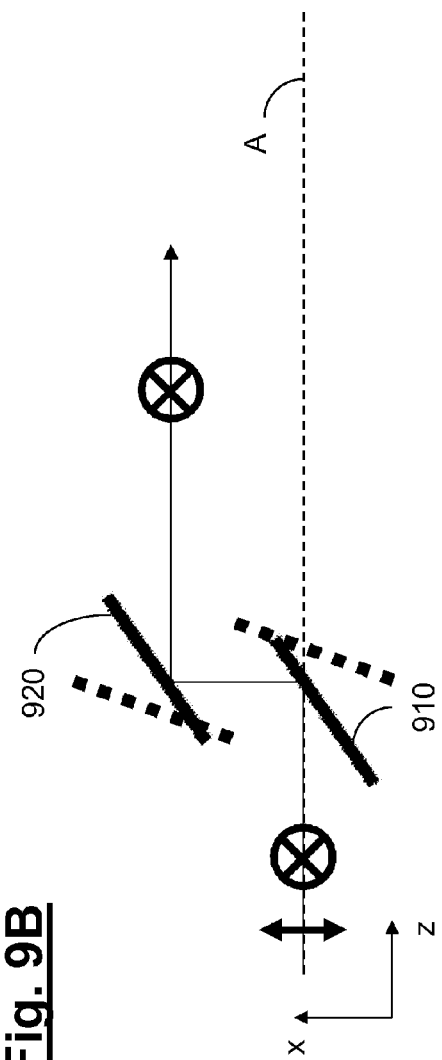

OPTICAL SYSTEM OF A MICROLITHOGRAPHIC PROJECTION EXPOSURE APPARATUS

CROSS REFERENCE TO RELATED APPLICATIONS

The present application is a continuation of, and claims benefit under 35 USC 120 to, international application PCT/EP2013/056442, filed Mar. 26, 2013, which claims benefit under 35 USC 119 of German Application No. 10 2012 206 153.3, filed Apr. 16, 2012. International application PCT/EP2013/056442 also claims priority under 35 USC 119(e) to U.S. Provisional Application No. 61/624,429, filed Apr. 16, 2012. The contents of each of these applications is incorporated by reference herein.

BACKGROUND OF THE INVENTION

Field of the Invention

The invention relates to an optical system of a microlithographic projection exposure apparatus.

Prior Art

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the lack of availability of suitable light-transmissive refractive materials, mirrors are used as optical components for the imaging process.

During the operation of a projection exposure apparatus, there is a need to set, in the illumination device, for the purpose of optimizing the imaging contrast, in a targeted manner, specific polarization distributions in the pupil plane and/or in the reticle and also to be able to make a change to the polarization distribution during the operation of the projection exposure apparatus.

In this case, one problem which occurs in EUV systems, in particular, is the increasing transmission loss associated with the reflections required for this purpose, as a result of which the performance properties of the projection exposure apparatus are impaired.

With regard to the prior art with respect to changing the polarization distribution in projection exposure apparatuses designed for the EUV range, reference is made merely by way of example to DE 10 2008 002 749 A1, US 2008/0192225 A1, WO 2006/111319 A2 and U.S. Pat. No. 6,999,172 B2.

SUMMARY OF THE INVENTION

It is an object of the present invention to provide an optical system of a microlithographic projection exposure apparatus, in particular for operation in the EUV, which, in conjunction with a comparatively low transmission loss, enables a flexible setting of the polarization distribution in the projection exposure apparatus.

This object is achieved in accordance with the features disclosed herein.

An optical system according to the invention of a microlithographic projection exposure apparatus, in particular for operation in the EUV, comprises:

at least one polarization-influencing arrangement having a first reflection surface and a second reflection surface, wherein the first reflection surface and the second reflection surface are arranged at an angle of 0°±10° or at an angle of 90°±10° relative to one another;

wherein light incident on the first reflection surface during the operation of the optical system forms an angle of 45°±5° with the first reflection surface; and wherein the polarization-influencing arrangement is rotatable about a rotation axis running parallel to the light propagation direction of light incident on the first reflection surface during the operation of the optical system.

The invention is based on the concept, in particular, of already generating linearly polarized output light from originally unpolarized input light (in particular EUV light) using two reflection surfaces or mirror elements, wherein the generation of the linear output polarization is obtained via two reflections taking place substantially at the Brewster angle. The Brewster angle in an EUV system is typically approximately 45°, since the refractive index of all appropriate (layer) materials at EUV wavelengths of less than 15 nm is close to the value 1.

In this case, the two reflection surfaces can be arranged either in a manner offset substantially parallel to one another or substantially perpendicularly to one another. On account of the reflection taking place at the first reflection surface at the Brewster angle, the light passing from the first reflection surface to the second reflection surface in the arrangement according to the invention is already almost completely s-polarized, as a result of which the reflectivity at the second reflection surface increases compared with the reflectivity in the case of unpolarized illumination.

Via this effective generation of a linear output polarization, in the polarization-influencing arrangement according to the invention, the direction of polarization of the light emerging from the arrangement or from the second reflection surface thereof can be varied by virtue of the fact that the arrangement is configured as rotatable about a rotation axis, wherein the rotation axis runs parallel to the light propagation direction of light incident on the first reflection surface during the operation of the optical system. This approach is based on the consideration that a rotation of the polarization-influencing arrangement about a rotation axis pointing along the respective input ray by a rotation angle β also results in a rotation of the output polarization direction by the same rotation angle β, since the polarization-determining geometry of the arrangement with regard to the Brewster angle or the plane of incidence for the Brewster reflection is likewise rotated by the rotation angle β.

In contrast, for instance, to the realization of a geometrical polarization rotation for a predetermined input polarization with generation of skew light rays (and with a plurality of (at least three) reflections), in the present invention unpolarized light can be used for setting the desired polarization distribution. Furthermore, in the construction according to the invention, the transmission loss can be significantly reduced on account of the smaller number of required reflection surfaces.

In accordance with one embodiment, during the operation of the optical system, a light ray reflected by the second reflection surface is reflected in an output direction, which is parallel to the input direction of the light incident on the first reflection surface.

In accordance with a further aspect, the invention also relates to an optical system of a microlithographic projection exposure apparatus, in particular for operation in the EUV, comprising:

- at least one polarization-influencing arrangement having a first reflection surface and a second reflection surface, wherein light reflected at the second reflection surface during the operation of the optical system is reflected parallel to the input direction of the light incident on the first reflection surface;
- wherein, during the operation of the optical system, light is incident on the first reflection surface with an angle of incidence $\Theta=\Theta_B\pm5°$, wherein $\Theta_B$ denotes the Brewster angle for the first reflection surface at an operating wavelength of the optical system; and
- wherein the polarization-influencing arrangement is rotatable about a rotation axis running parallel to the light propagation direction of light incident on the first reflection surface during the operation of the optical system.

In accordance with one embodiment, the polarization-influencing arrangement converts unpolarized light incident on the first reflection surface during the operation of the optical system into linearly polarized light emerging from the second reflection surface.

In accordance with one embodiment, the optical system furthermore comprises a mirror element assigned respectively to each second reflection surface, the mirror element reflecting light reflected at the relevant second reflection surface during the operation of the optical system. The mirror element can be arranged, in particular, in a manner tiltable about at least one tilting axis. Furthermore, the mirror element can have an optically active surface of substantially annular geometry.

In further embodiments, the second reflection surface of the respective polarization-influencing optical arrangement can also be arranged in a manner tiltable about at least one tilting axis.

In accordance with one embodiment, the optical system comprises an array composed of a plurality of polarization-influencing arrangements according to the invention, wherein a plurality of corresponding polarization-influencing arrangements are respectively adjacent to one another in two preferably mutually perpendicular spatial directions. In this case, in particular, in the array, the reflection surfaces respectively adjacent to one another in one of two mutually perpendicular spatial directions can run parallel to one another.

Via such an array it is possible, in the concept according to the invention, to realize both a flexible setting of the polarization distribution (also designated hereinafter as "polarization shaping") and a flexible setting of the intensity distribution in the pupil plane (also designated hereinafter as "pupil shaping"), wherein according to the invention this can, in particular, already be effected with only two reflections and thus with a correspondingly low loss of intensity (and also a corresponding saving of structural space).

In accordance with one embodiment, the optical system can furthermore comprise for this purpose a mirror arrangement having a plurality of individual mirrors via which light emerging from the second reflection surfaces can be reflected. The individual mirrors can be, in particular, adjustable independently of one another, in order to realize the above-described pupil shaping in a flexible manner.

In accordance with a further aspect, the invention relates to an illumination device of a microlithographic projection exposure apparatus designed for operation in the EUV, wherein the illumination device comprises an optical system having features as discussed above.

In accordance with one embodiment, the illumination device comprises a field facet mirror having a plurality of field facets and a pupil facet mirror having a plurality of pupil facets, wherein in the beam path of the light rays reflected at the field facets during the operation of the illumination device, there is arranged respectively one of the polarization-influencing arrangements for influencing the polarization state of the light ray.

The invention furthermore relates to a microlithographic projection exposure apparatus comprising an illumination device and a projection lens, wherein the illumination device comprises an optical system having the features described above, and to a method for microlithographically producing microstructured components.

In accordance with one embodiment, for all mirrors arranged in the illumination device and/or in the projection lens downstream of the polarization-influencing arrangement in the light propagation direction, the respective reflection surface is arranged either at an angle of a maximum of 20°, preferably a maximum of 15°, or at an angle of 90°±10°, preferably 90°±5°, with respect to the direction of the light incident on the reflection surface during the operation of the projection exposure apparatus. In other words, in the illumination device and/or in the projection lens downstream of the polarization-influencing arrangement in the light propagation direction, only such mirrors are provided which are operated either with grazing incidence (with an angle of a maximum of 20°, preferably a maximum of 15°, of the incident light relative to the respective reflection surface) or with substantially normal incidence (i.e. with an angle of 90°±10°, more preferably 90°±5°, relative to the respective reflection surface). This configuration has the advantage that the polarization state for the reflections taking place at the relevant angles is maintained at least largely in an unchanged fashion (and not significantly influenced e.g. by so-called s-p splitting). In the context of the present application, e.g. the wording "with an angle of 90°±10°" is to be understood as "with an angle in the range from 80° to 100°", etc.

Further configurations of the invention can be gathered from the description and the claims. The invention is explained in greater detail below on the basis of exemplary embodiments illustrated in the accompanying figures.

BRIEF DESCRIPTION OF THE DRAWINGS

In the figures:

FIGS. 2-5A-5B, 6A-6B and 7 show schematic illustrations for elucidating different embodiments of the present invention;

FIGS. 9A-9B show schematic illustrations for elucidating a further possible embodiment of the invention.

DETAILED DESCRIPTION OF PREFERRED EMBODIMENTS

Figure 10:
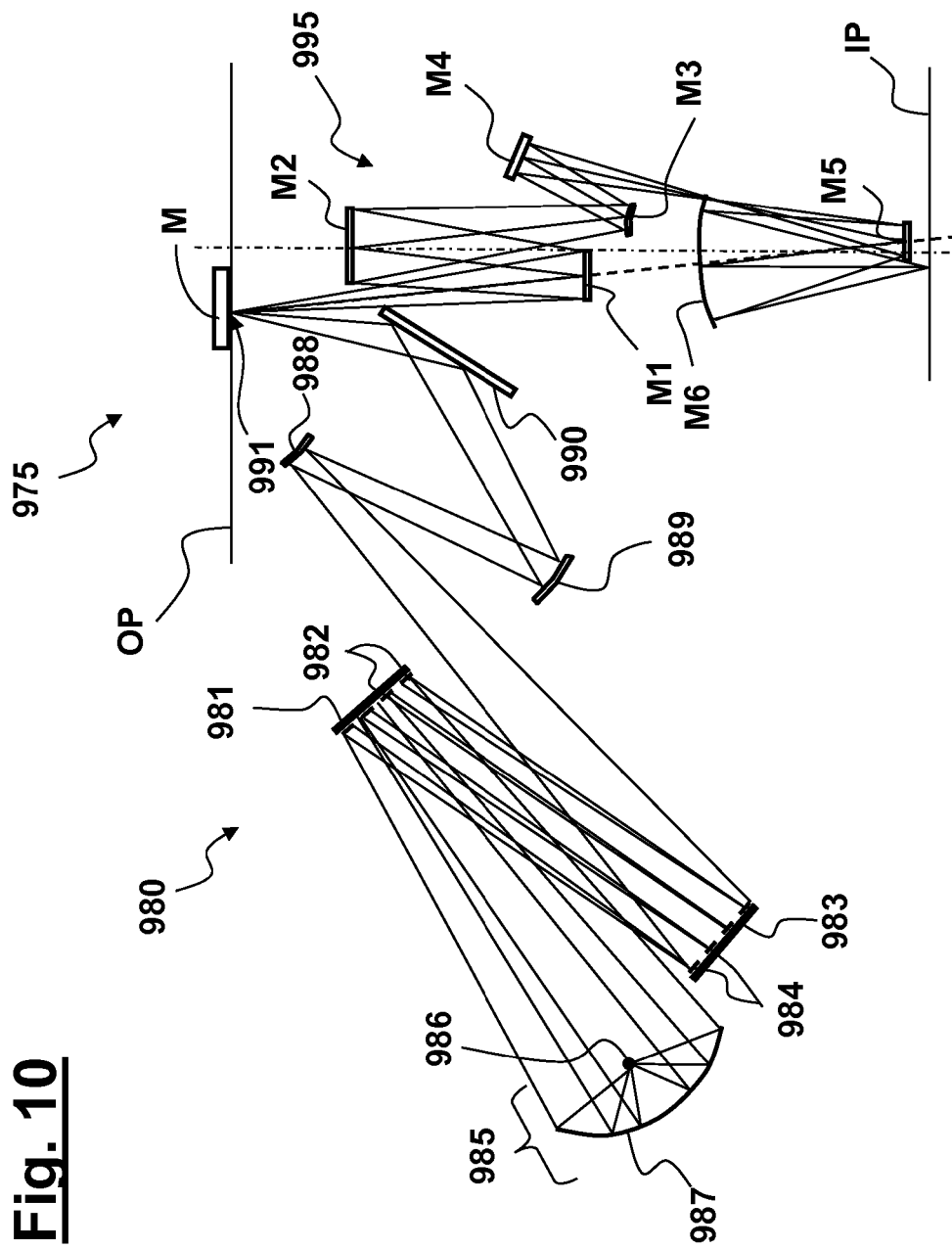
FIG. 10 shows a schematic illustration of one fundamentally possible construction of a projection exposure apparatus designed for operation in the EUV.

FIG. 10 shows a schematic illustration of an exemplary projection exposure apparatus which is designed for operation in the EUV and in which the present invention can be realized. In accordance with FIG. 10, an illumination device 980 in a projection exposure apparatus 975 designed for EUV comprises a field facet mirror 981 (having facets 982) and a pupil facet mirror 983 (having facets 984). The light from a light source unit 985 comprising a plasma light source 986 and a collector mirror 987 is directed onto the field facet mirror 981. A first telescope mirror 988 and a second telescope mirror 989 are arranged in the light path downstream of the pupil facet mirror 983. A deflection mirror 990 is arranged downstream in the light path, the deflection mirror directing the radiation incident on it onto an object field 991 in the object plane OP of a projection lens 995 comprising six mirrors M1-M6. A reflective structure-bearing mask M is arranged at the location of the object field 991, the mask being imaged into an image plane IP with the aid of the projection lens 995 (having six mirrors M1-M6).

In this illumination device 980 a flexible setting of the polarization distribution (also called "polarization shaping"), and a flexible setting of the intensity distribution in the pupil plane ("pupil shaping") can now be effected, e.g. as will be described below with reference to FIG. 8, via a polarization-influencing optical arrangement according to the invention. Hereinafter, in this respect the principle underlying the present invention will firstly be illustrated with reference to FIG. 1.

Figure 1:
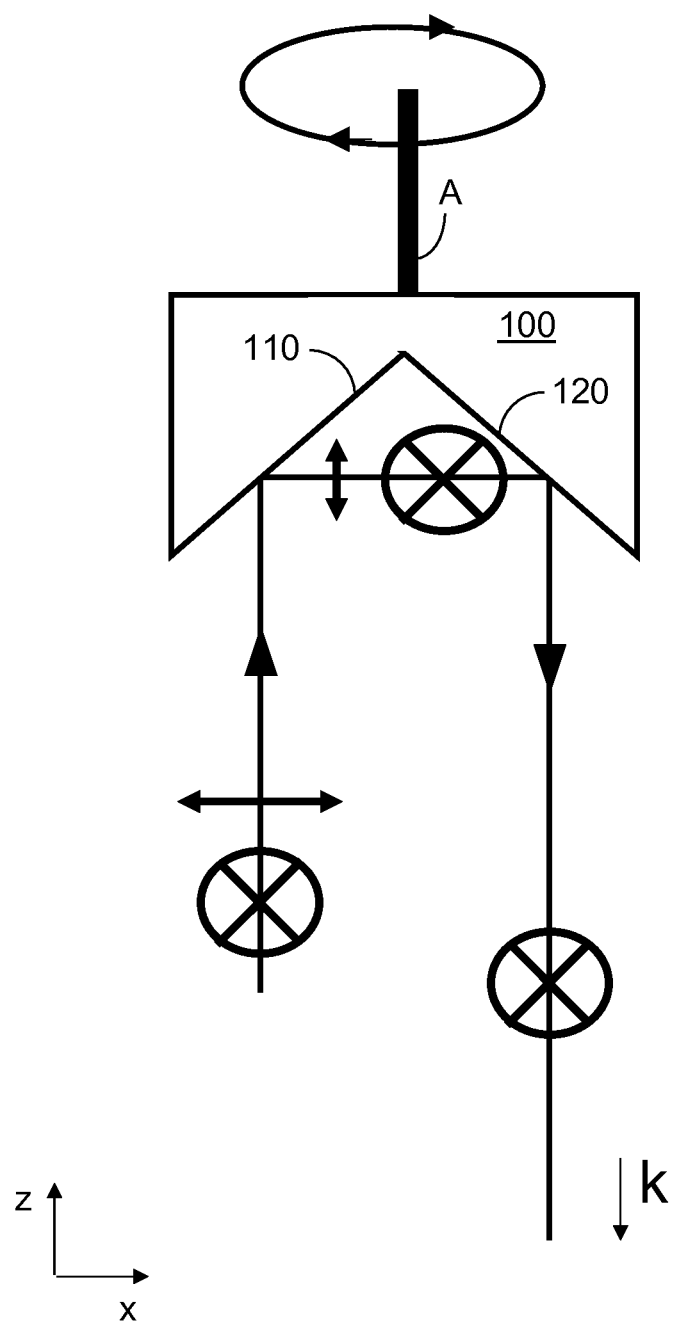
FIG. 1 shows a schematic illustration for elucidating the principle underlying the present invention.

In accordance with FIG. 1, unpolarized light is incident on a first reflection surface 110 at an angle of incidence—corresponding to the Brewster angle $\Theta_B$—of 45°, from which surface it is reflected in the direction of a second reflection surface 120, which is oriented at an angle of 90° with respect to the first reflection surface 110. The Brewster angle is typically approximately 45°, since the refractive index in the EUV is close to the value 1. One suitable HR layer material which can be used at the reflection surfaces in the EUV is, for example, MoSi (i.e. molybdenum layers on a silicon substrate).

The unpolarized state of the input light incident on the first reflection surface 110 is symbolized here and hereinafter by the fact that both polarization directions are depicted for the relevant light ray.

On account of the reflection taking place at the Brewster angle at the first reflection surface 110, s-polarized light is reflected to the greatest possible extent, whereas p-polarized light is transmitted to the greatest possible extent or absorbed in the material. Accordingly, the light passing from the first reflection surface 110 to the second reflection surface 120 is already almost completely s-polarized, as is indicated in the illustration in FIG. 1 by the significantly smaller double-headed arrow (symbolizing the p-polarization) oriented in the plane of the drawing. At the second reflection surface 120, a renewed reflection at the Brewster angle now again takes place, such that, as likewise indicated in FIG. 1, the residual portion of p-polarization that possibly still remained previously is also eliminated in the light finally emerging from the second reflection surface 120.

For the loss of intensity in the arrangement 100 according to the invention, this means that although a loss of intensity of approximately 50% relative to the intensity of the unpolarized light incident on the arrangement takes place in the case of the reflection at the first reflection surface 110, the reflectivity at the second reflection surface 120 is increased compared with the reflectivity in the case of unpolarized illumination.

In the concrete example of FIG. 1, but without the invention being restricted thereto, the first reflection surface 110 and the second reflection surface 120 are both embodied on one and the same optical element 100, which, in order to realize the above-described geometry or the reflection angles mentioned, has the wedge shape illustrated in cross section in FIG. 1, the wedge shape continuing into the plane of the drawing (i.e. in the y-direction in the coordinate system depicted), and is provided with corresponding coatings that are highly reflective to EUV radiation (HR coatings) in order to form the reflection surfaces 110, 120.

The polarization-influencing optical arrangement 100 constructed from the reflection surfaces 110 and 120 is rotatable about a rotation axis running parallel to the light propagation direction of light incident on the first reflection surface during the operation of the optical system. A rotation axis "A" is depicted in FIG. 1, the axis being chosen for the case where a light beam (having a centroid ray running along the rotation axis) is incident on the arrangement or the optical element 100. By contrast, in the case of a light ray incident only on the first reflection surface, the rotation axis is preferably arranged exactly along the light ray.

This rotatable configuration is based on the consideration that a rotation of the polarization-influencing optical arrangement 100 about a rotation axis pointing along the respective input ray by a rotation angle β also results in a rotation of the output polarization direction by the same rotation angle β, since the polarization-determining geometry of the arrangement 100 with regard to the Brewster angle, in particular the plane of incidence for the Brewster reflection, is likewise rotated.

Figure 2:
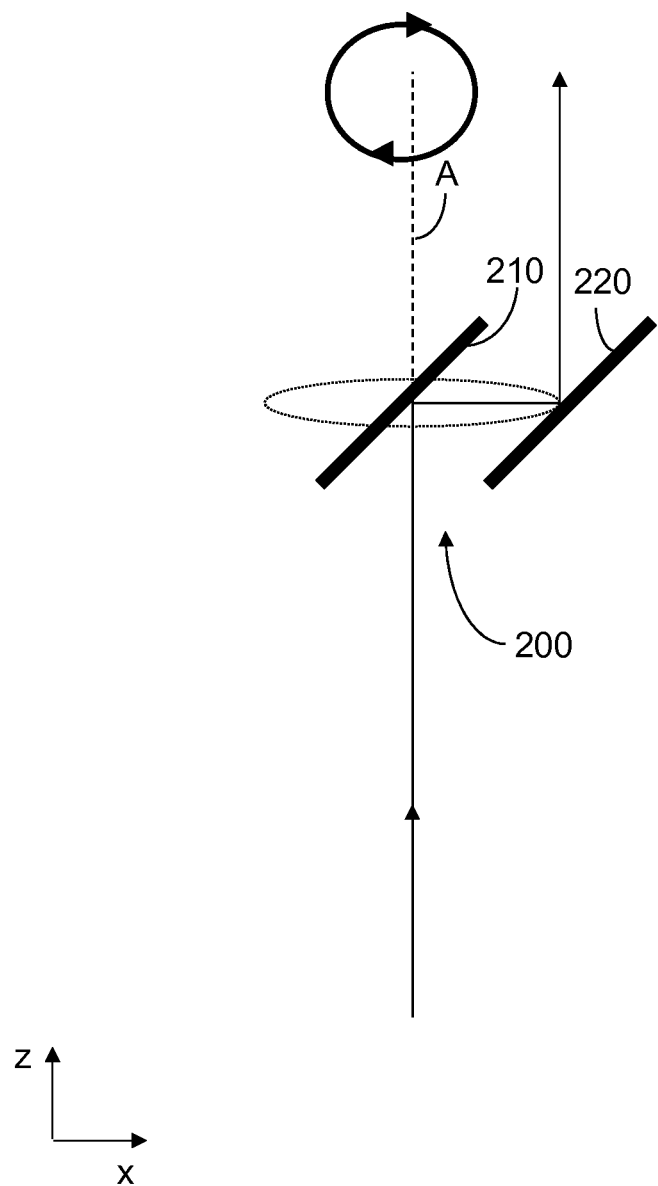

FIG. 2 shows an optical arrangement 200, in which the principle described above with reference to FIG. 1 is likewise used, but wherein the light having the desired linear output polarization direction propagates in the same direction as the unpolarized light incident on the arrangement (i.e. in the positive z-direction in the coordinate system depicted), that is to say as it were in "quasi-transmission". For this purpose, in contrast to FIG. 1, the reflection surfaces 210, 220 are not arranged perpendicularly, but rather parallel to one another. In the arrangement 200 in FIG. 2 as well, the rotation of the entire arrangement 200 about the rotation axis A pointing along the input ray by a rotation angle β results in a rotation of the output polarization direction by the same rotation angle β. Furthermore, the light ray emerging from the second reflection surface 220 moves on a circle arc about the rotation axis A, wherein the output polarization direction for each rotation angle β respectively runs tangentially with respect to the rotation axis A.

Figure 3:
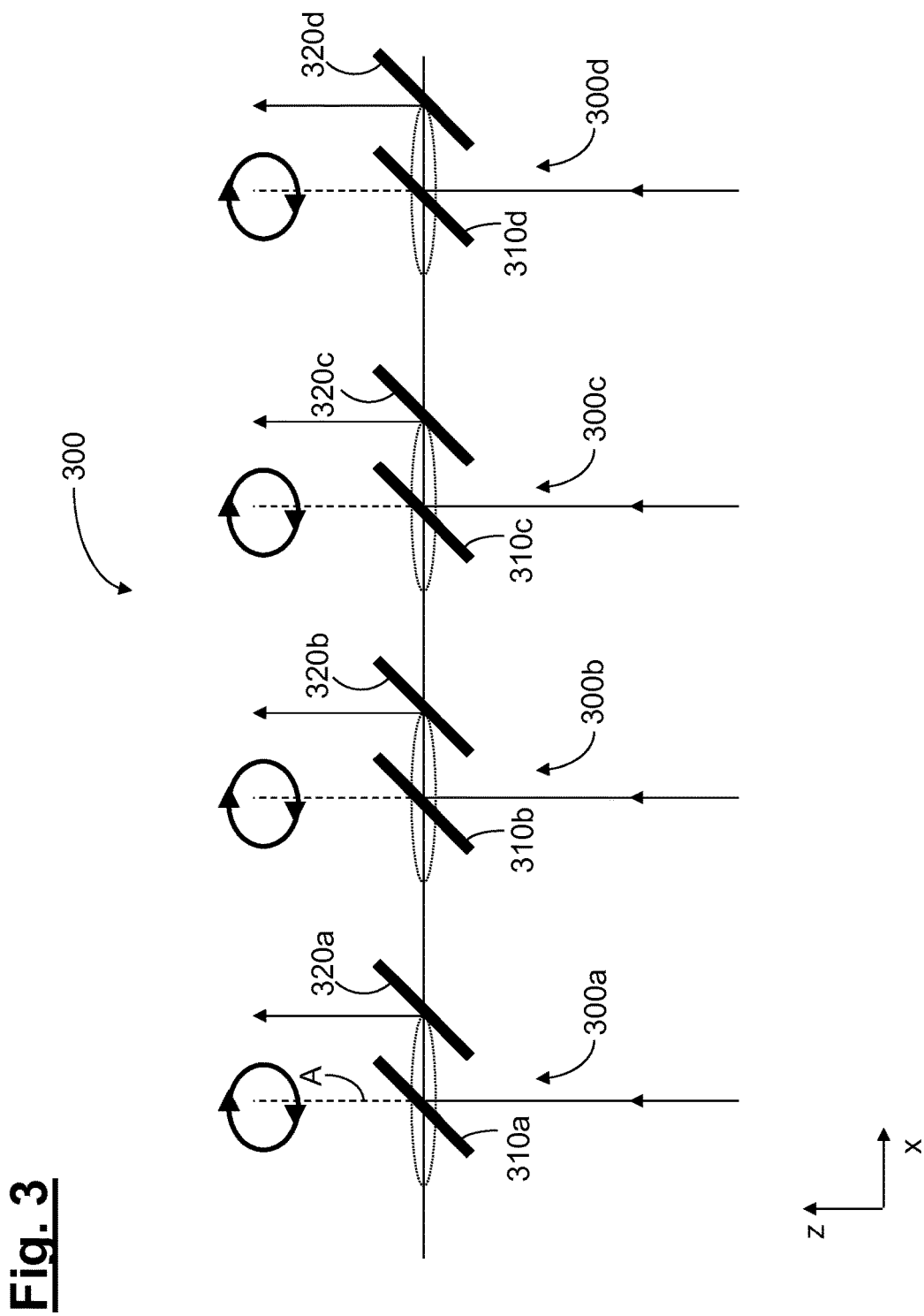

In accordance with FIG. 3, an optical arrangement 300 composed of a plurality of individual arrangements 300a, 300b, 300c, . . . composed of reflection surfaces 310a, 320a, 310b, 320b, 310c, 320c, . . . can also be provided, wherein the optical arrangement can be constructed in particular in a matrix-like fashion. In this case, in contrast to a mirror arrangement in the form of an MMA (="micro mirror array") that is conventionally used e.g. in an illumination device for flexibly producing different illumination settings, the reflection surfaces 310a, 320a, 310b, 320b, 310c, 320c, . . . according to the invention in accordance with FIG. 3 can indeed also have larger "macroscopic" dimensions e.g. of the order of magnitude in the range of 1-10 cm. In a further configuration, the arrangement shown in FIG. 3 can also make possible "pupil shaping" by virtue of the fact that the respective second reflection surfaces 320*a*, 320*b*, 320*c*, . . . are designed to be tiltable, such that a light ray respectively reflected at a second reflection surface 320*a*, 320*b*, 320*c*, . . . , depending on the tilting angle set, is directed onto a desired position in the pupil plane and produces there an illumination spot corresponding to a predefined intensity distribution or a desired illumination setting.

Figure 4:
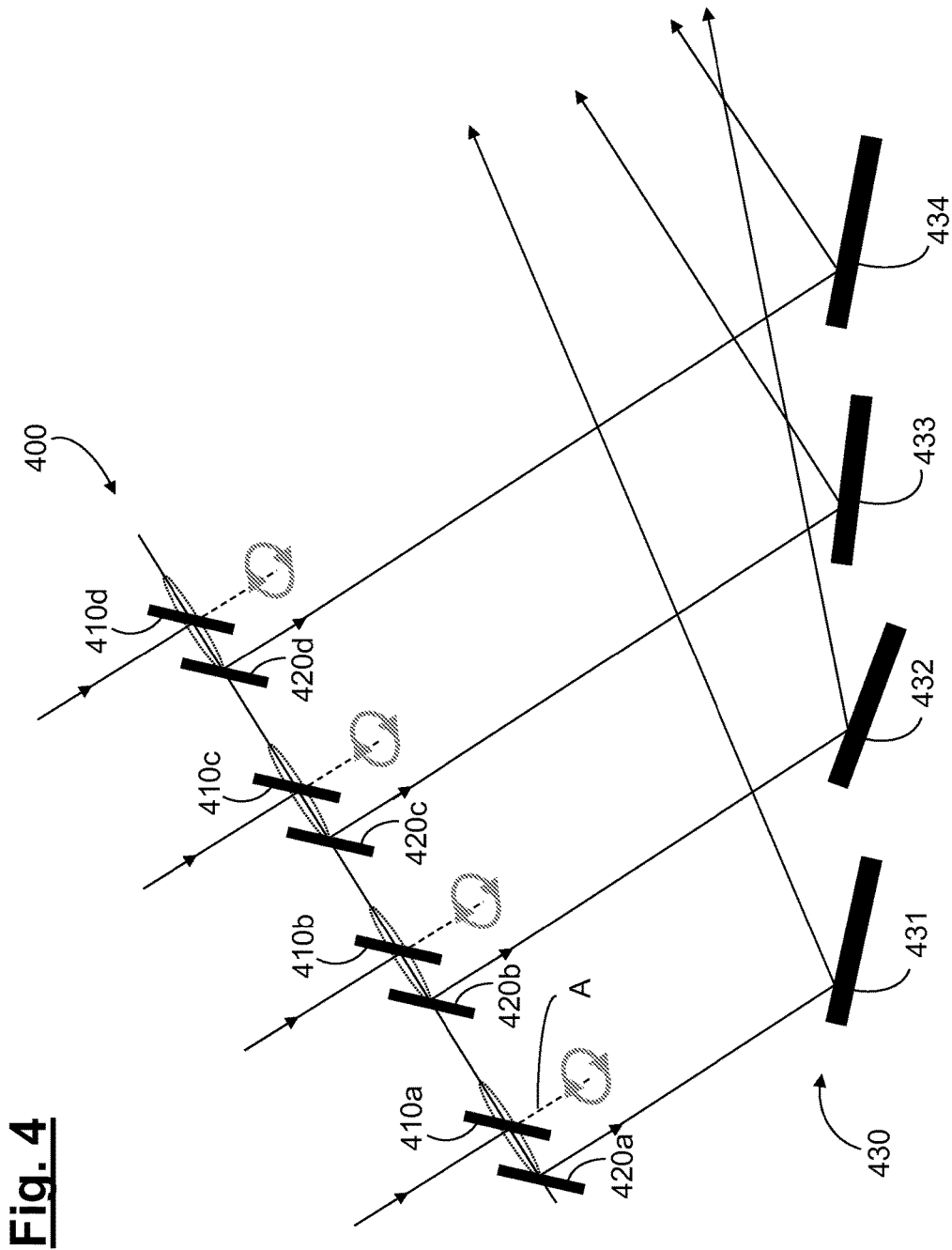

In accordance with FIG. 4, an arrangement 400—configured analogously to FIG. 3—composed of reflection surfaces 410*a*, 420*a*, 410*b*, 420*b*, 410*c*, 420*c*, . . . can also be combined with a further mirror arrangement 430 composed of a plurality of individual mirrors 431, 432, 433, . . . in order to perform polarization shaping via the polarization-influencing optical arrangement 400 and pupil shaping, i.e. the setting of a desired intensity distribution e.g. in the pupil plane of the illumination device, via the mirror arrangement 430. As can be seen from FIG. 4, in this case each of the light rays reflected at the second reflection surfaces 420*a*, 420*b*, 420*c*, . . . is directed onto a respective individual mirror 431, 432, 433, . . . of the mirror arrangement 430 and is directed by the latter, depending on the tilting angle of the relevant individual mirror 431, 432, 433, . . . , onto a desired location in the pupil plane.

Hereinafter, with reference to FIGS. 5A-5B, a description is given of a further embodiment, which, with regard to the "polarization-shaping" arrangement 500, is fundamentally based on the principle described with reference to FIG. 1 insofar as the light which has the desired linear output polarization direction and is reflected by the second reflection surface 520 propagates in an opposite direction relative to the unpolarized light incident on the first reflection surface 510 of the arrangement 500. A further mirror element 540 serves for "coupling out" this light from the arrangement 500 composed of first and second reflection surfaces e.g. for the purpose of subsequent "pupil shaping" analogously to FIG. 4. For this purpose, the mirror element 540 can have a substantially annular (spherical-shell-shaped) geometry.

Figure 5:
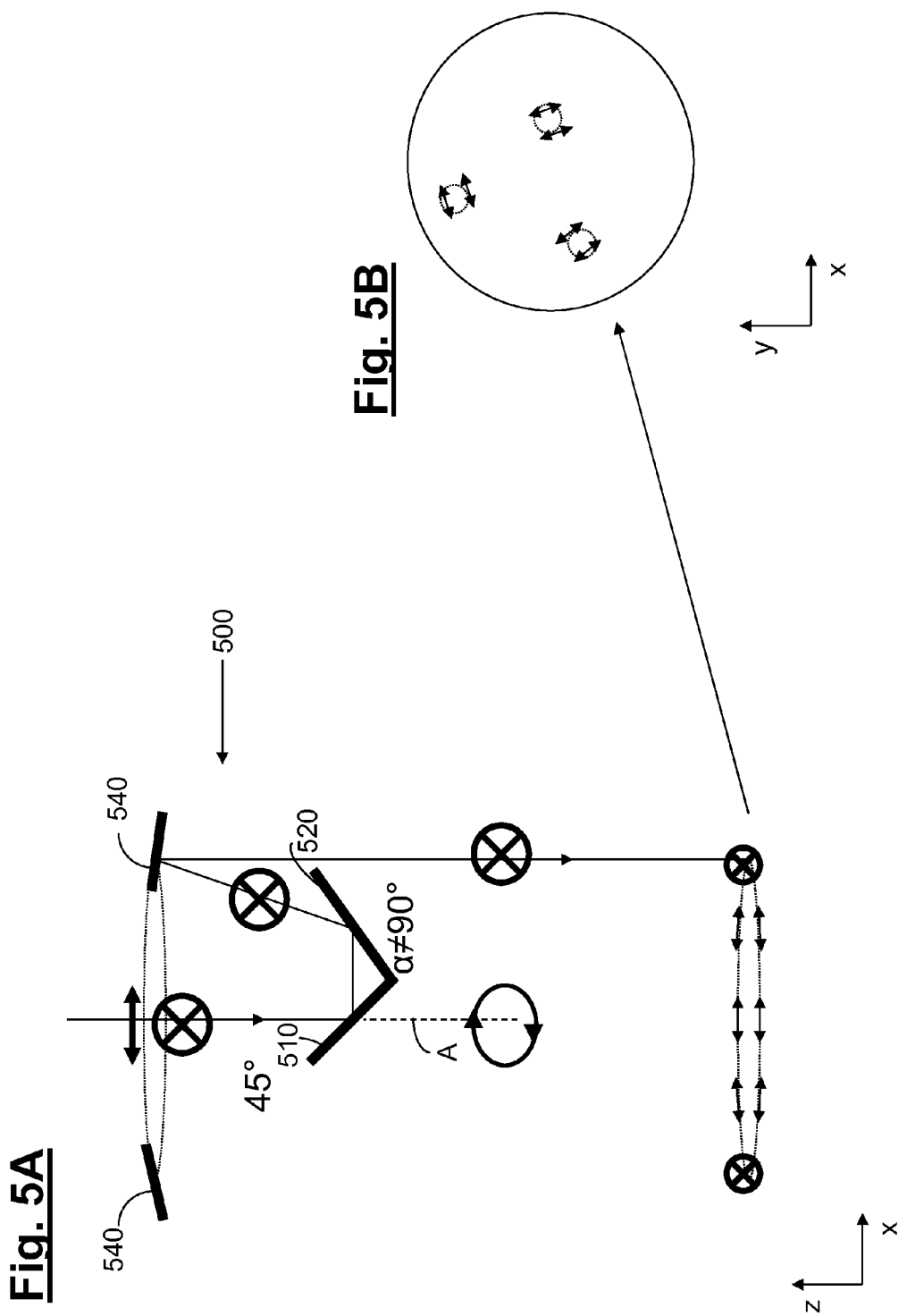

In the exemplary embodiment in FIGS. 5A-5B, in order to realize the coupling out of the light reflected by the second reflection surface 520 (i.e. "reflection out" from the original beam path), the two reflection surfaces 510, 520 are arranged at an angle with respect to one another that differs from 90° (typically by a few degrees) (i.e. $\alpha \neq 90°$, e.g. $\alpha = 94°$), in order that the light ray reflected at the second reflection surface 520 is not reflected back exactly in the opposite direction of the light ray incident on the first reflection surface 510. Consequently, in accordance with FIGS. 5A-5B, the light ray reflected at the second reflection surface 520 can be directed via the mirror element 540 in the same direction as the unpolarized light ray incident on the polarization-influencing optical arrangement (i.e. in the negative z-direction in the coordinate system depicted).

As is indicated in FIG. 5A in the lower part of the illustration and also in FIG. 5B, in the case of the polarization-influencing optical arrangement 500 in FIGS. 5A-5B as well, a rotation of the arrangement 500 about a rotation axis A pointing along the input ray by a rotation angle $\beta$ results in a rotation of the output polarization direction by the same rotation angle $\beta$, wherein the light ray emerging from the second reflection surface 520—now after reflection at the mirror element 540—moves on a circle arc about the rotation axis A, wherein the output polarization direction for each rotation angle $\beta$ respectively runs tangentially with respect to the rotation axis A.

Figure 6:
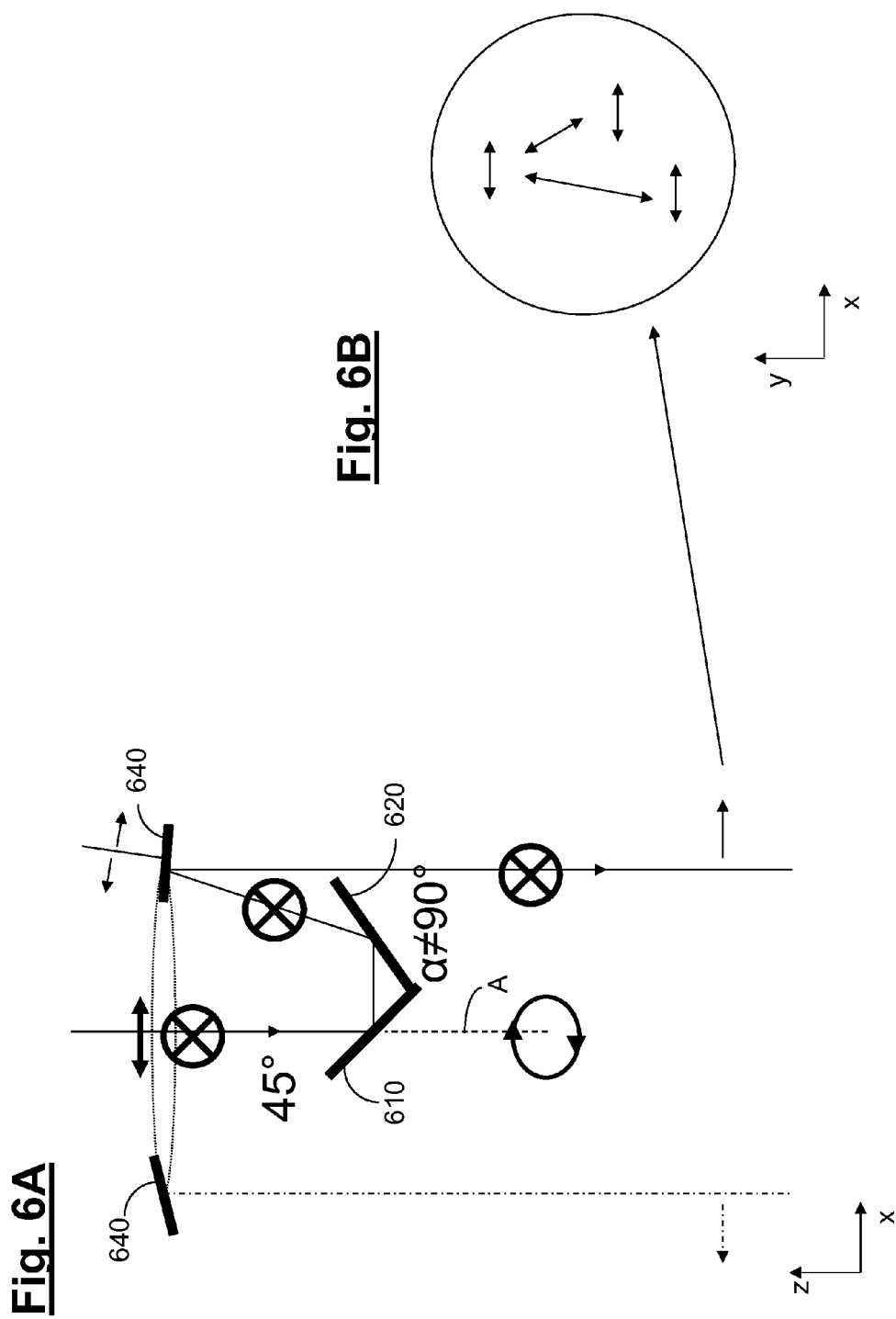

As indicated in FIGS. 6A-6B, the mirror element 640 can also be designed to be tiltable and can thus in turn be used for "pupil shaping" by virtue of a light ray respectively reflected at the mirror element 640 being directed onto a desired position in the pupil plane and producing there an illumination spot corresponding to a desired illumination setting.

In further embodiments, pupil shaping proceeding from the arrangement 300 shown in FIG. 3 can also be realized by the first reflection surfaces 310*a*, 310*b*, 310*c*, . . . or the second reflection surfaces 310*a*, 310*b*, 310*c*, . . . being configured in a tiltable fashion. Such a configuration has the advantage, for instance, in comparison with the embodiments described with reference to FIGS. 5A-5B and 6A-6B that locations in the region of the pupil center—for instance when setting a so-called "low sigma illumination setting" in which only a region of the pupil plane which is delimited by a circle having a comparatively small diameter is intended to be illuminated—can also be illuminated with the correspondingly polarized light.

Figure 7:
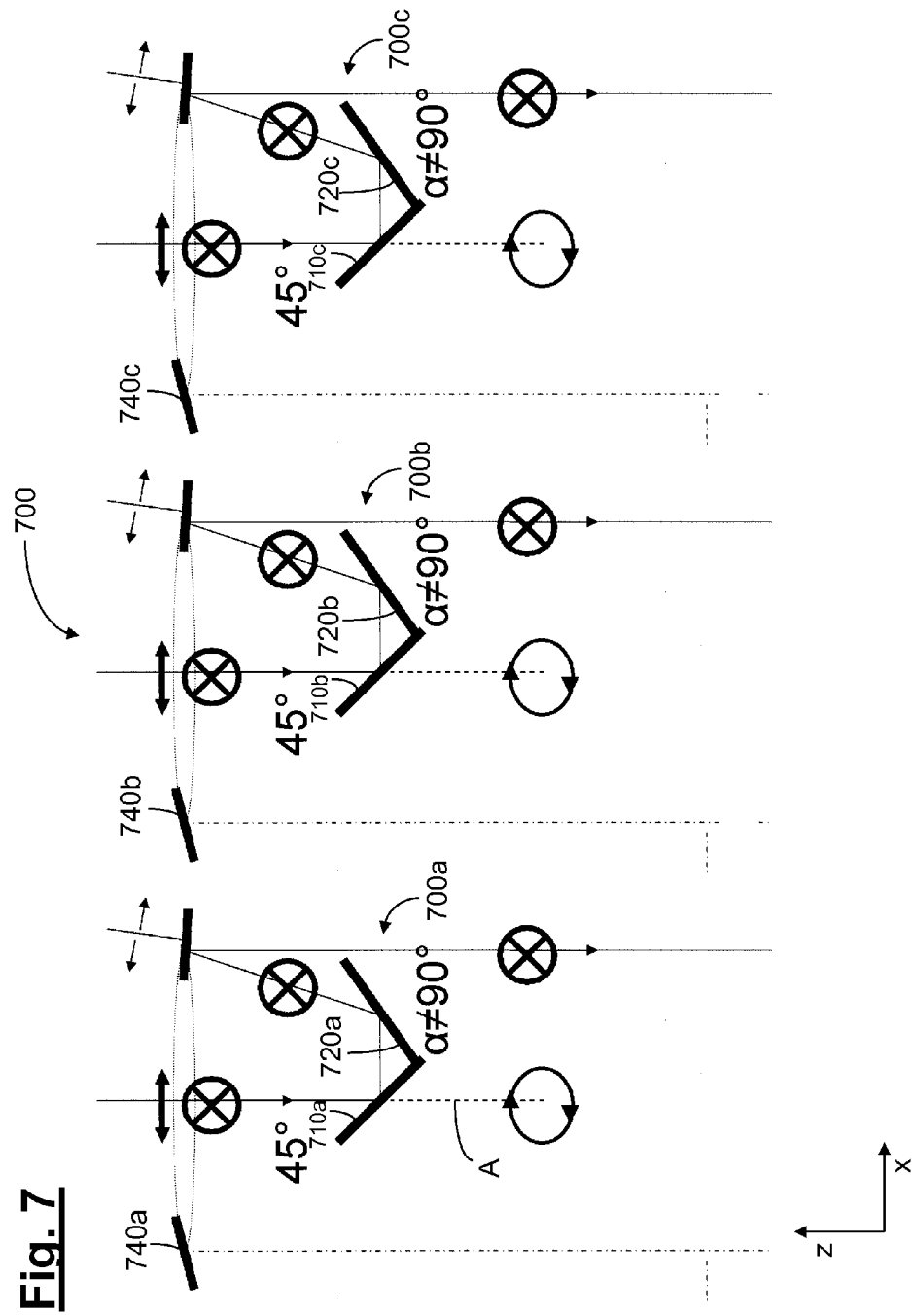

Furthermore, from the embodiment described above with reference to FIGS. 5A-5B, analogously to FIG. 3, it is likewise possible to construct a (in particular matrix-type) polarization-influencing optical arrangement 700 composed of a plurality of corresponding individual arrangements 700*a*, 700*b*, 700*c*, . . . , as is illustrated in FIG. 7.

Figure 8:
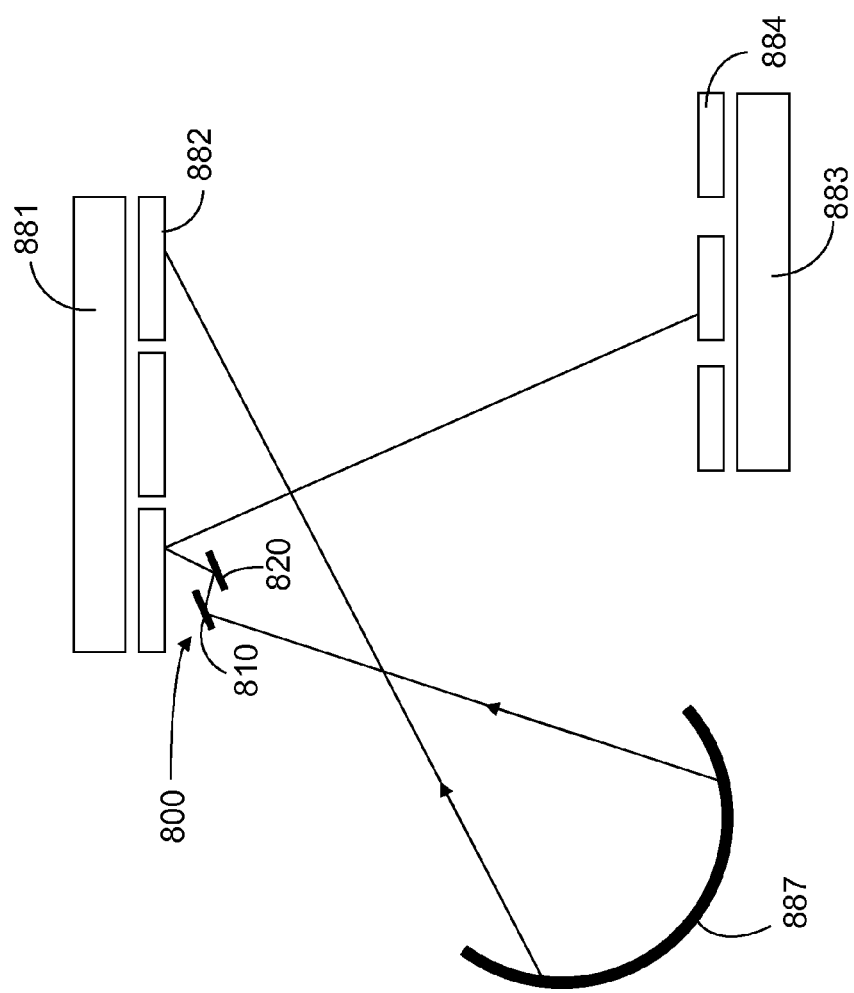
FIG. 8 shows a schematic illustration for elucidating one possible realization of the invention in an illumination device of a projection exposure apparatus designed for operation in the EUV.

FIG. 8 shows a schematic illustration for elucidating one possible realization of the invention in an illumination device of a projection exposure apparatus designed for operation in the EUV.

In FIG. 8, only the collector mirror 887 of a light source unit of the illumination device is illustrated, from which mirror the illumination light, analogously to FIG. 10, is incident via a field facet mirror 881 (having facets 882) on a pupil facet mirror 883 (having facets 884). As already described, in the light propagation direction upstream of the polarization shaping via the polarization-influencing optical arrangement according to the invention, the EUV light is unpolarized (at least to the greatest possible extent). In the light path upstream of the field facet mirror 881, a polarization setting is effected via an arrangement according to the invention composed of reflection surfaces 810, 820 in accordance with FIG. 8. In particular, upstream of each individual facet 882 of the field facet mirror 881, a corresponding ("double-mirror") arrangement 800 composed of reflection surfaces 810, 820 can be provided, wherein each of the arrangements is in turn configured in a manner rotatable about a rotation axis running along the respectively incident light ray, for the polarization setting according to the invention. In further embodiments it is possible—depending on the concrete design of the illumination device—to provide the arrangement composed of reflection surfaces 810, 820 or an array- or matrix-like arrangement of corresponding individual arrangements also between the field facet mirror 881 and the pupil facet mirror 883 in the light propagation direction or else downstream of the pupil facet mirror 883 in the light propagation direction.

Furthermore, the arrangement of the further optical components or mirrors following the polarization-influencing optical arrangement according to the invention in the light propagation direction within the illumination device is preferably constituted such that downstream of the polarization shaping according to the invention, there are arranged in the light path only mirrors which are operated with grazing incidence (e.g. with an angle between incident ray and reflection surface of the respective mirror of less than 15°, in particular less than 10°) or normal incidence (e.g. with an angle between incident ray and reflection surface of the respective mirror of at least 80°, in particular 90°). What can be achieved in this way is that the polarization set via the polarization-influencing optical arrangement according to the invention is maintained and the reflectivities occurring at the further optical components or mirrors are also as far as possible independent of the polarization direction set.

FIGS. 9A-9B show schematic illustrations for elucidating a further possible embodiment of the invention. The arrangement shown in FIGS. 9A-9B comprise, analogously to the embodiment of FIG. 2, two reflection surfaces 910, 920 being arranged parallel to one another. However, different to FIG. 2, the two reflection surfaces 910, 920 are rotatable not only about a rotation axis "A" pointing along the input ray (i.e. about a rotation axis pointing along the z-direction in the coordinate system depicted, see FIG. 9B), but are also rotatable about an additional rotation axis being perpendicular to the drawing plane (i.e. about a rotation axis pointing along the y-direction in the coordinate system depicted, see FIG. 9A). As a consequence of this additional rotation axis and the thereby achieved additional degree of freedom, the position or orientation of the two reflection surfaces 910, 920 can be modified, in particular, between the position of FIG. 9B, in which the reflections at the reflection surfaces 910, 920 take place substantially at the Brewster angle, and the position of FIG. 9A, in which the reflections at the reflection surfaces 910, 920 take place with an angle of incidence being relatively small compared to the Brewster angle, for example an angle of incidence (defined relative to the surface normal on the respective reflection surface) between 5° and 30°.

In the latter position (shown in FIG. 9A), due to lack of a "preferred direction" with respect to polarization in the geometry of the reflecting arrangement (i.e. due to the fact that the reflecting arrangement is not sensitive to the polarization of the incoming light), the light emerging from the second reflection surface 920 is still substantially unpolarized. Further, by rotating the reflection surfaces 910, 920 about the axis of rotation along the y-direction, the degree of polarization ("DOP") can be adjusted substantially between the extreme values of DOP=0 and DOP=1. Furthermore, rotation of the entire arrangement 900 about the rotation axis "A" pointing along the input ray by a rotation angle β results in a rotation of the output polarization direction by the same rotation angle β, as already been discussed above with reference to FIG. 2 and the following figures.

Even though the invention has been described on the basis of specific embodiments, numerous variations and alternative embodiments are evident to the person skilled in the art, e.g. by a combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:
1. An optical system, comprising:
a polarization-influencing arrangement comprising a first reflection surface and a second reflection surface, wherein:
the first and second reflection surfaces are arranged at an angle of 0°±10° relative to each other, or the first and second reflection surfaces are arranged at an angle of 90°±10° relative to each other;
during use of the optical system, light incident on the first reflection surface has an angle of 45°±5° relative to the first reflection surface;
the polarization-influencing arrangement is rotatable about a rotation axis which is parallel to a light propagation direction of light incident on the first reflection surface during operation of the optical system;
the polarization-influencing arrangement is configured so that, during operation of the optical system, the polarization-influencing arrangement converts unpolarized light incident on the first reflection surface into linearly polarized light emerging from the second reflection surface;
there is no reflection surface along the light path between the first and second reflection surfaces; and
the optical system is an EUV microlithographic optical system.

2. The optical system of claim 1, wherein, during operation of the optical system, a light ray reflected by the second reflection surface is reflected in a direction which is parallel to a direction of the light incident on the first reflection surface.

3. The optical system of claim 1, further comprising a mirror element configured so that, during operation of the optical system, light reflected at the second reflection surface is subsequently reflected by the mirror element.

4. The optical system of claim 3, wherein the mirror element is tiltable about an axis.

5. The optical system of claim 3, wherein the mirror element comprises an optically active surface having substantially annular geometry.

6. The optical system of claim 1, wherein the second reflection surface is tiltable about an axis.

7. The optical system of claim 1, wherein:
the optical system comprises an array which comprises plurality of polarization-influencing arrangements; and
for each polarization-influencing arrangement:
the polarization-influencing element comprises a first reflection surface and a second reflection surface;
the first and second reflection surfaces are arranged at an angle of 0°±10° relative to each other, or the first and second reflection surfaces are arranged at an angle of 90°±10° relative to each other;
during use of the optical system, light incident on the first reflection surface has an angle of 45°±5° relative to the first reflection surface; and
the polarization-influencing arrangement is rotatable about a rotation axis which is parallel to a light propagation direction of light incident on the first reflection surface during operation of the optical system.

8. The optical system of claim 7, wherein the array comprises reflection surfaces adjacent to each other in one of two mutually perpendicular spatial directions which run parallel to each other.

9. The optical system of claim 7, further comprising a mirror arrangement comprising a plurality of individual mirrors configured so that, during operation of the optical system, light emerging from the second reflection surfaces is reflected by mirror arrangement.

10. The optical system of claim 9, wherein the individual mirrors are adjustable independently of each other.

11. The optical system of claim 1, further comprising a mirror element, wherein during operation of the optical system:

the mirror element reflects light reflected at the second reflection surface; and
a light ray reflected by the second reflection surface is reflected in a direction which is parallel to a direction of the light incident on the first reflection surface.

12. The optical system of claim 1, wherein, during operation of the optical system, light is incident on the first reflection surface with an angle of incidence that is within 5° of the Brewster angle for the first reflection surface at an operating wavelength of the optical system.

13. A device, comprising:
an optical system according to claim 1,
wherein the device is an EUV microlithographic illumination device.

14. The device of claim 13, comprising:
a field facet mirror comprising a plurality of field facets; and
a pupil facet mirror comprising a plurality of pupil facets, wherein:
the device is configured so that, during use of the device, a polarization-influencing element is in a path of a light ray reflected at the field facets to influence a polarization state of the light ray.

15. An apparatus, comprising:
an illumination device comprising an optical system according to claim 1; and
a projection lens,
wherein the apparatus is a microlithographic projection exposure apparatus.

16. The apparatus of claim 15, wherein:
for each mirror arranged in the illumination device and/or in the projection lens downstream of the polarization-influencing arrangement in a light propagation direction during operation of the apparatus, a reflection surface of the mirror is arranged at an angle with respect to the light incident on the reflection surface of the mirror; and
the angle is at most 20° or the angle is 90°±10°.

17. A method of using a microlithographic projection exposure apparatus comprising an illumination device and a projection lens, the method comprising:
using the illumination device to illuminate structures of a mask; and
using the projection lens to project at least some of the illuminated structures of the mask onto a light-sensitive material,
wherein the illumination device comprises the optical system of claim 1.

18. The optical system of claim 1, wherein the polarization-influencing arrangement comprises precisely two reflection surfaces.

19. The optical system of claim 1, further comprising a mirror element configured so that, during operation of the optical system, light reflected from the mirror element impinges on the first reflection surface.

20. The optical system of claim 1, further comprising first and second mirror elements, wherein:
the first mirror element is configured so that, during operation of the optical system, light reflected from the mirror element impinges on the first reflection surface; and
the second mirror element is configured so that, during operation of the optical system, light reflected at the second reflection surface is subsequently reflected by the mirror element.

21. An optical system, comprising:
a polarization-influencing arrangement comprising a first reflection surface and a second reflection surface; and
a mirror element configured so that, during operation of the optical system, light reflected at the second reflection surface is subsequently reflected by the mirror element,
wherein:
the mirror element comprises an optically active surface having substantially annular geometry;
the first and second reflection surfaces are arranged at an angle of 0°±10° relative to each other, or the first and second reflection surfaces are arranged at an angle of 90°±10° relative to each other;
during use of the optical system, light incident on the first reflection surface has an angle of 45°±5° relative to the first reflection surface;
the polarization-influencing arrangement is rotatable about a rotation axis which is parallel to a light propagation direction of light incident on the first reflection surface during operation of the optical system; and
the optical system is an EUV microlithographic optical system.

22. An optical system, comprising:
a polarization-influencing arrangement comprising a first reflection surface and a second reflection surface,
wherein during operation of the optical system:
light reflected at the second reflection surface is reflected in a direction parallel to a direction of the light incident on the first reflection surface;
light is incident on the first reflection surface with an angle of incidence that is within 5° of the Brewster angle for the first reflection surface at an operating wavelength of the optical system; and
the polarization-influencing arrangement is rotatable about a rotation axis which is parallel to a light propagation direction of light incident on the first reflection surface;
the polarization-influencing arrangement is configured so that the polarization-influencing arrangement converts unpolarized light incident on the first reflection surface into linearly polarized light emerging from the second reflection surface;
there is no reflective surface along the light path between the first and second surfaces reflection surfaces; and
wherein the optical system is a microlithographic optical system.

23. The optical system of claim 22, wherein the optical system is an EUV microlithographic optical system.

24. The optical system of claim 22, wherein the polarization-influencing arrangement comprises precisely two reflection surfaces.

25. The optical system of claim 22, further comprising a mirror element configured so that, during operation of the optical system, light reflected from the mirror element impinges on the first reflection surface.

26. The optical system of claim 22, further comprising first and second mirror elements, wherein:
the first mirror element is configured so that, during operation of the optical system, light reflected from the mirror element impinges on the first reflection surface; and the second mirror element is configured so that, during operation of the optical system, light reflected at the second reflection surface is subsequently reflected by the mirror element.

27. The optical system of claim 22, further comprising a mirror element configured so that, during operation of the optical system, light reflected at the second reflection surface is subsequently reflected by the mirror element.

* * * * *